(12) United States Patent
Chen et al.

(10) Patent No.: US 12,445,052 B2
(45) Date of Patent: Oct. 14, 2025

(54) POWER CONVERTING DEVICE AND CONTROL METHOD THEREOF

(71) Applicant: Novatek Microelectronics Corp., Hsinchu (TW)

(72) Inventors: Tuo-Kuang Chen, Hsinchu (TW); Lo Pang-Yen Ting, Hsinchu County (TW); Nien-Hsiu Yen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 259 days.

(21) Appl. No.: 18/331,181

(22) Filed: Jun. 8, 2023

(65) Prior Publication Data

US 2024/0413748 A1    Dec. 12, 2024

(51) Int. Cl.
*H02M 3/156* (2006.01)

(52) U.S. Cl.
CPC .................................. *H02M 3/156* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135;
(Continued)

(56) References Cited

U.S. PATENT DOCUMENTS 9,069,370 B2 * 6/2015 Soenen ................... G05F 1/575
9,285,399 B2 * 3/2016 Babazadeh ........ G01R 19/0092
(Continued)

FOREIGN PATENT DOCUMENTS

| TW | 201507337 | 2/2015 |
| TW | 201547168 | 12/2015 |
| TW | 202245388 | 11/2022 |

OTHER PUBLICATIONS

"Office Action of Taiwan Counterpart Application", issued on May 24, 2024, p. 1-p. 5.

*Primary Examiner* — Jeffrey A Gblende
(74) *Attorney, Agent, or Firm* — JCIPRNET

(57) ABSTRACT

A power converting device includes a power transistor, a detecting device, a signal converter and a controller. The detecting device obtains a detection voltage by detecting an output voltage on the output end of the power converting device and a detection current by detecting an operation current of the power transistor. The signal converter converts the detection voltage from a first format to a second format, and converts the detection current from the first format to the second format. The controller receives the detection voltage and the detection current in the second format. Wherein the controller compares the detection voltage with a first voltage threshold value and a second voltage threshold value to adjust a control code, and generates a control signal to a control end of the power transistor according to the control code.

20 Claims, 4 Drawing Sheets

(58) Field of Classification Search
CPC ........ H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069

See application file for complete search history.

(56) References Cited

U.S. PATENT DOCUMENTS

| | | | |
|---|---|---|---|
| 9,859,783 B1 | 1/2018 | Chang et al. | |
| 10,211,732 B2* | 2/2019 | Li | H02M 1/32 |
| 10,644,580 B2* | 5/2020 | Nagamatsu | H02M 3/07 |
| 11,496,125 B2* | 11/2022 | Okada | H03K 17/08128 |
| 12,212,331 B2* | 1/2025 | She | H03M 1/08 |
| 2017/0366080 A1 | 12/2017 | Chang et al. | |
| 2023/0037202 A1 | 2/2023 | Fujimura et al. | |
| 2024/0152168 A1* | 5/2024 | Uchimoto | G05F 1/575 |
| 2024/0322690 A1* | 9/2024 | Tsuruyama | H02M 3/158 |

\* cited by examiner

POWER CONVERTING DEVICE AND CONTROL METHOD THEREOF

BACKGROUND

Field of the Invention

The invention relates to a power converting device and a control method thereof, and more particularly, to the power converting device and a control method thereof which could dynamically adjust an output voltage according to a load status.

Description of Related Art

A power converting device in prior art usually has a fixed control signal, so that the power converting device generates an output voltage with fixed value. When a load status is changed, the output voltage may deviate from the target voltage specification, and could not be adjusted to a target voltage in real time. In order to avoid the above problem, the target voltage is usually set directly to a higher value to ensure smooth an operation of a system under different load statuses. Furthermore, the higher value of the target voltage cost the system more power consumption. That is, in the prior art, it is impossible to optimize the target voltage setting according to different load statuses.

SUMMARY

The invention provides a power converting device and a control method for the power converting device, which could dynamically adjust an output voltage according to a load status.

According to an embodiment of the invention, the power converting device includes a power transistor, a detecting device, a signal converter and a controller. The power transistor is coupled between an input end of the power converting device and an output end of the power converting device. The detecting device is coupled to the output end of the power converting device and the power transistor, and obtains a detection voltage by detecting an output voltage on the output end of the power converting device and a detection current by detecting an operation current of the power transistor. The signal converter is coupled to the detecting device, converts the detection voltage from a first format to a second format, and converts the detection current from the first format to the second format. The controller is coupled to a control end of the power transistor and the signal converter, receives the detection voltage and the detection current in the second format. Wherein the controller compares the detection voltage with a first voltage threshold value and a second voltage threshold value to adjust a control code, and generates a control signal to a control end of the power transistor according to the control code.

According to an embodiment of the invention, the control method for the e power converting device includes: obtaining a detection voltage, by a detecting device, by detecting an output voltage on an output end of the power converting device; obtaining a detection current, by the detecting device, by detecting an operation current of a power transistor of the power converting device; converting, by a signal converter, the detection voltage from a first format to a second format, and converting the detection current from the first format to the second format; comparing, by a controller, the detection voltage with a first voltage threshold value and a second voltage threshold value to adjust a control code; and, generating, by the controller, a control signal to a control end of the power transistor according to the control code.

To sum up, the power converting device of present disclosure detects a detection voltage on the output end to obtain a detection voltage, and detects an operation current of the power transistor to obtain a detection current in real time. By comparing the detection voltage with two voltage threshold values, a controller of the power converting device may adjust a control code according to a comparison result, and the power converting device may generate a control signal for controlling a power transistor of the power converting device according to the control code. Such as that, the output voltage generated by the power converting device could be adjusted dynamically according to the load status of the power converting device. The output voltage could be closed to a target voltage, and a power consumption of the power converting device could be saved, too.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
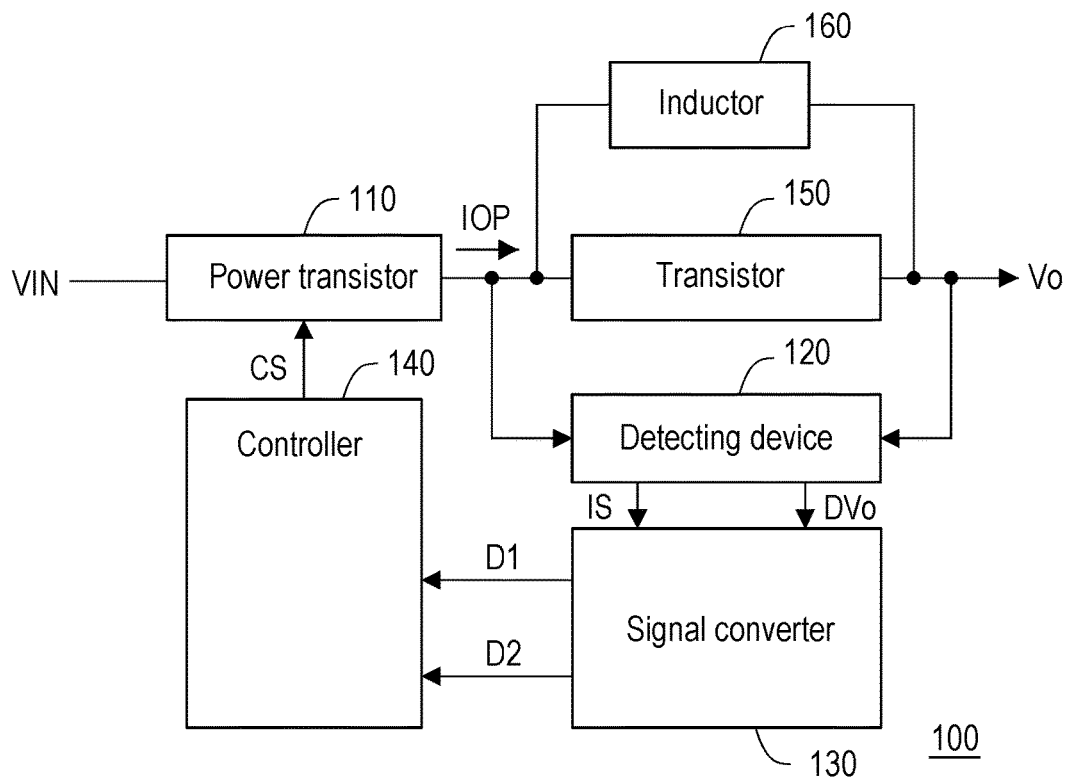
FIG. 1 illustrates a block diagram of a power converting device according to an embodiment of present disclosure.

The term "couple (or connect)" throughout the specification (including the claims) of this application are used broadly and encompass direct and indirect connection or coupling means. For instance, if the disclosure describes a first apparatus being coupled (or connected) to a second apparatus, then it should be interpreted that the first apparatus could be directly connected to the second apparatus, or the first apparatus could be indirectly connected to the second apparatus through other devices or by a certain coupling means. In addition, terms such as "first" and "second" mentioned throughout the specification (including the claims) of this application are only for naming the names of the elements or distinguishing different embodiments or scopes and are not intended to limit the upper limit or the lower limit of the number of the elements not intended to limit sequences of the elements. Moreover, elements/components/steps with same reference numerals represent same or similar parts in the drawings and embodiments. Elements/ components/notations with the same reference numerals in different embodiments may be referenced to the related description.

Please refer to FIG. 1, which illustrates a block diagram of a power converting device according to an embodiment of present disclosure. In FIG. 1, the power converting device 100 includes a power transistor 110, a detecting device 120, a signal converter 130, a controller 140, a transistor 150 and an inductor 160. In this embodiment, the power converting device 100 may be a DC-to-DC buck converter. A first end of the power transistor 110 is coupled to an input end of the power converting device 100 for receiving an input voltage VIN. A control end of the power transistor 110 is coupled to the controller 140 to receive a control signal CS. A second end of the power transistor 110 is coupled to the inductor 160, a first end of the transistor 150 and the detecting device 120. On the other hand, a second end of the transistor 150 is coupled to an output end of the power converting device 100, where the output end of the power converting device 100 generates an output voltage Vo. A second end of the inductor 160 and the detecting device 120 are also coupled to the output end of the power converting device 100.

The power converting device 100 is configured to perform a power conversion operation on the input voltage VIN by switching the power transistor 110 and the transistor 150. Both the input voltage VIN and the output voltage Vo could be direct current (DC) voltages.

In this embodiment, the detecting device 120 is configured to detect an operation current IOP of the power transistor 110 to obtain a detection current IS, and the detecting device 120 is further configured to detect the output voltage Vo of the power converting device 100 to obtain a detection voltage DVo.

In this embodiment, the detecting device 120 may sense the operation current IOP flowing through the power transistor 110 to obtain the detection current IS. In here, the detection current IS obtained by the detecting device 120 may be in analog format. Furthermore, the detecting device 120 may obtain the detection voltage DVo by dividing the output voltage Vo on the output end of the power converting device 100. The detection voltage DVo obtained by the detecting device 120 may be in analog format, too.

Please note that the detecting device 120 may detect the operation current IOP of the power transistor 110 and the output voltage Vo of the power converting device 100 simultaneously. The detection operations for detecting the operation current IOP of the power transistor 110 and the output voltage Vo of the power converting device 100 may be operated in real time.

The signal converter 130 receives the detection current IS and the detection voltage DVo. The signal converter 130 converts the detection current IS and the detection voltage DVo from a first format to a second format. In this embodiment, the signal converter 130 may be an analog to digital converter (ADC), and the signal converter 130 may convert the detection current IS in analog format to a detection current D2 which is in digital mode. Moreover, the signal converter 130 may also convert the detection voltage DVo in analog format to a detection voltage D1 which is in digital mode. The signal converter 130 transmits the detection voltage D1 and the detection current D2 in digital format to the controller 140.

In this embodiment, the controller 140 may preset a first voltage threshold value and a second voltage threshold value in advance, wherein the first voltage threshold value may be larger than the second voltage threshold value. The controller 140 may compare the detection voltage D1 with the first voltage threshold value and the second voltage threshold value to generate a comparison result, and adjust a control code according to the comparison result. In this embodiment, the detection voltage D1, the first voltage threshold value, the second voltage threshold value and the control code may all be codes.

The control code may be set to an initial value in an initial state by the controller 140. The initial value could be determined according to a normal load status of the power converting device 100.

In detail operation of the power converting circuit 100, when the detection voltage D1 is larger than the first voltage threshold value, the controller 140 may decrease the control code by a first step value. In this embodiment, when the detection D1 is larger than the first threshold value, the output voltage Vo of the power converting circuit 100 may be too high and larger than a target voltage. Increasing of the output voltage Vo of the power converting circuit 100 may be caused by load decreasing of the power converting circuit 100. Such as that, the controller 140 may hence decrease the control code by the first step value.

On the other hand, when the detection D1 is smaller than the second threshold value, the output voltage Vo of the power converting circuit 100 may be too low and smaller than a target voltage. Decreasing of the output voltage Vo of the power converting circuit 100 may be caused by load increasing of the power converting circuit 100. Such as that, the controller 140 may hence increase the control code by the second step value.

In this embodiment, the first step value may be equal or different from the second step value. In some embodiment, the first step value and the second step value could be 1.

On the other hand, the controller 140 further converts the control code to the control signal CS. In this embodiment, the control signal CS may be a pulse-width-modulation (PWM) signal. A duty ratio of the control signal CS could be controlled by the controller 140 according to a value of the digital code. In detail, the controller 140 may adjusts the duty ratio of the control signal CS according to a variation of the control code. For example, if the control code is increased, the duty ratio could be increased by the controller 140, and if the control code is decreased, the duty ratio could be decreased by the controller 140.

By adjusting the duty ratio of the control signal CS, the operation current IOP flowing through the power transistor 110 could be adjusted correspondingly. In detail, if the duty ratio of the control signal is increased, the operation current IOP flowing through the power transistor 110 could be increased accordingly. If the duty ratio of the control signal is decreased, the operation current IOP flowing through the power transistor 110 could be decreased accordingly. It could be seen, by adjusting the operation current IOP flowing through the power transistor 110 corresponding to a load variation of the voltage converting device 100, the output voltage Vo of the power converting device 100 could be maintained on the target voltage in real time. Such as that, the output voltage Vo of the power converting device 100 will not too high or too low, a working efficiency of a load circuit could be maintained and power consumption of the power converting device 100 could be saved, too.

Figure 2:
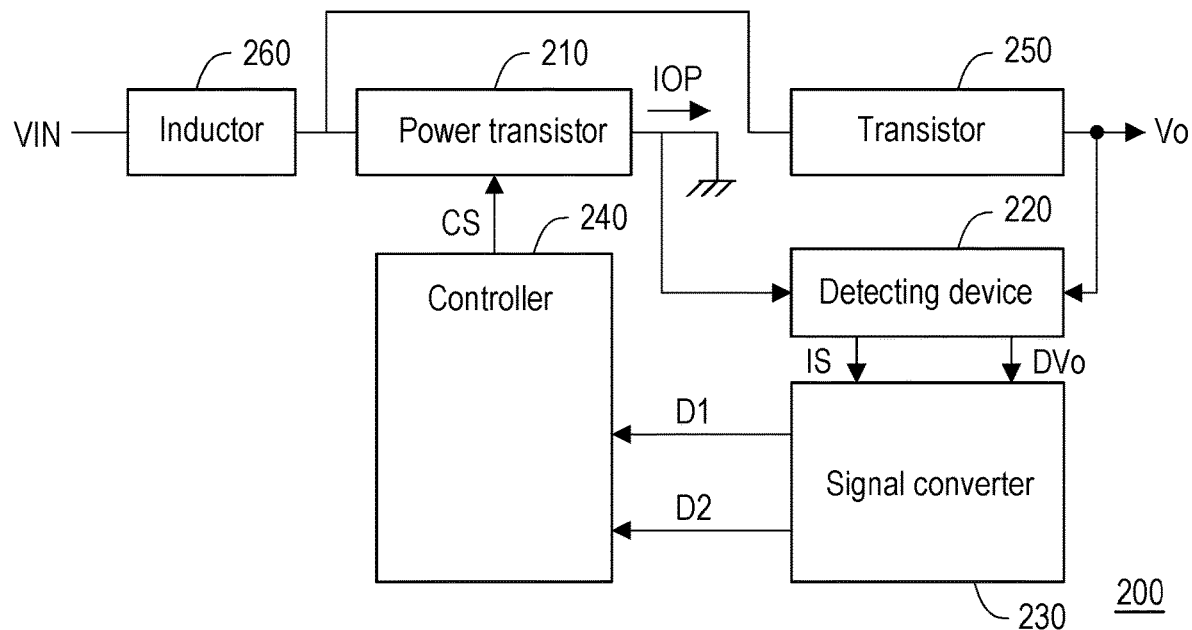
FIG. 2 illustrates a block diagram of a power converting device according to another embodiment of present disclosure.

Please refer to FIG. 2, which illustrates a block diagram of a power converting device according to another embodiment of present disclosure. In FIG. 2, the power converting device 200 includes a power transistor 210, a detecting device 220, a signal converter 230, a controller 240, a transistor 250 and an inductor 260. In this embodiment, the power converting device 100 may be a DC-to-DC boost converter. A first end of the power transistor 210 receives an input voltage VIN through the inductor 260. A control end of the power transistor 210 is coupled to the controller 240 to receive a control signal CS. A second end of the power transistor 210 is coupled to the detecting device 220 and a reference ground end. On the other hand, a first end of the transistor 250 is coupled to a coupling end of the inductor 260 and the power transistor 210; second end of the transistor 250 is coupled to an output end of the power converting device 200, where the output end of the power converting device 200 generates an output voltage Vo.

The power converting device 200 is configured to perform a power conversion operation on the input voltage VIN by switching the power transistor 210 and the transistor 250. Both the input voltage VIN and the output voltage Vo could be direct current (DC) voltages.

The detecting device 220 detects an operation current IOP of the power transistor 210 through the second end of the power transistor 210, and the detecting device 220 obtains a detection current IS correspondingly. The detecting device 220 further detects the output voltage Vo of the power converting device 200 to obtain a detection voltage DVo.

The detection voltage DVo and the detection current IS are transmitted to the signal converter 230, and the signal converter 230 may perform an analog-to-digital conversion operation on the detection voltage DVo and the detection current IS to respectively obtain the detection voltage D1 and the detection current D2 which are digital codes.

The controller 240 receives the detection voltage D1 and the detection current D2, performs a comparison operation on the detection voltage D1 to generate a digital code, and convert the digital code to generate the control signal CS. Detail operation of the controller 240 is same as to the controller 140 in the embodiment of FIG. 1, and no more repeated description here.

Figure 3:
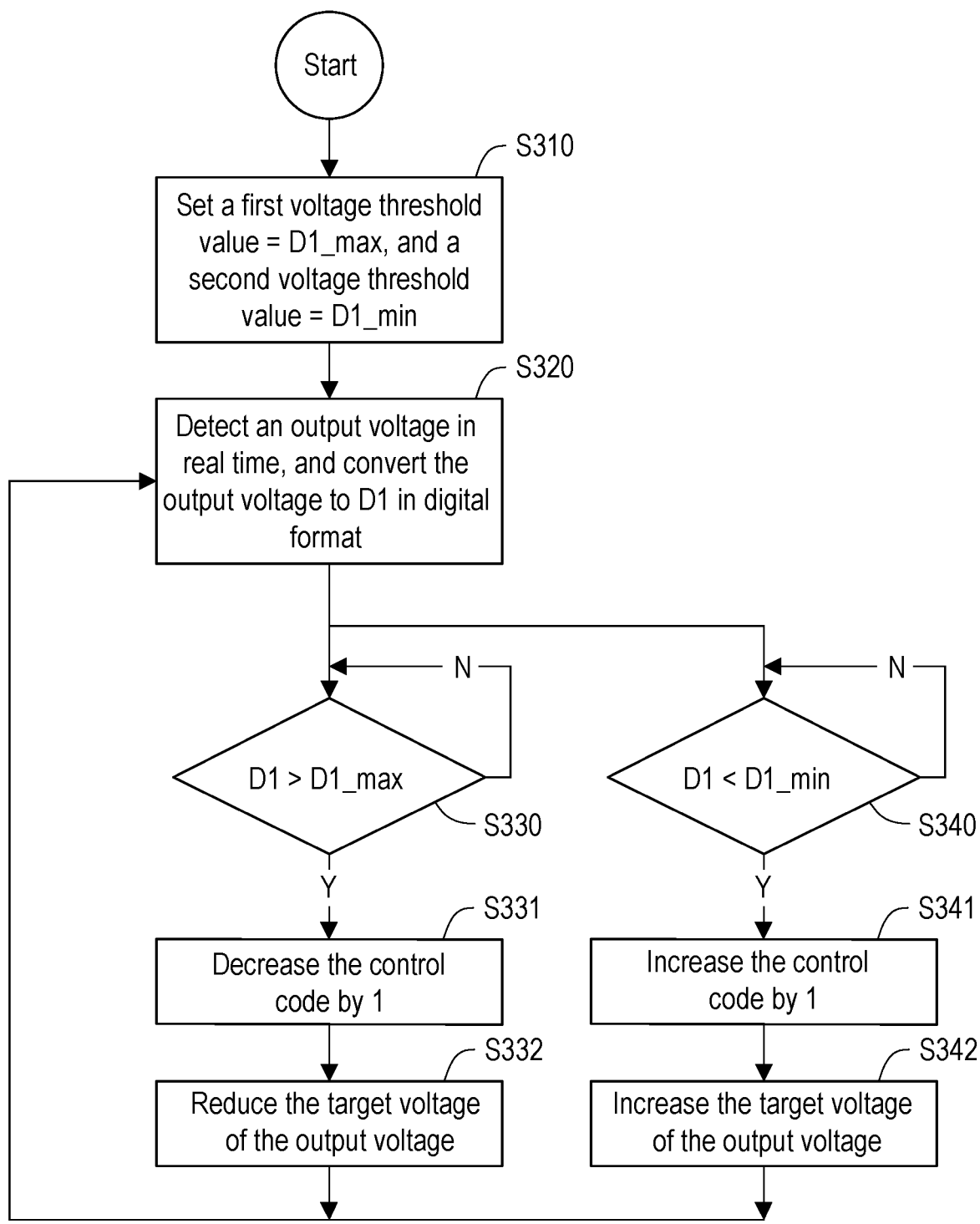
FIG. 3 illustrates a flow chart of operation of a power converting device according to an embodiment of present disclosure.

Please refer to FIG. 3, which illustrates a flow chart of operation of a power converting device according to an embodiment of present disclosure. In step S310, a controller of the power converting device sets a first voltage threshold value (e.g., D_max) and a second voltage threshold value (e.g., D_min). The first voltage threshold value may correspond to a maximum value of an output voltage of the power converting device, and the second voltage threshold value may correspond to a minimum value of the output voltage of the power converting device.

In step S320, an output voltage of the power converting device could be detected in real time, and a signal converting circuit may convert a detection voltage in analog format to a detection voltage (e.g., D1) in digital format. Furthermore, the power converting device compares the detection voltage (e.g., D1) with the first voltage threshold value (e.g., D_max) and the second voltage threshold value (e.g., D_min) in real time. If the detection voltage D1 is larger than the first voltage threshold value D_max (step S330), step S331 could be performed, and a control code generated by the controller of the power converting device could be decreased by 1. Then, in step S332, the controller may generate a control signal to a power transistor of the power converting device with lower duty ratio corresponding to the control code, and a target voltage of the power converting device could be reduced.

On the other hand, if the detection voltage D1 is smaller than the second voltage threshold value D_min (step S340), step S341 could be performed, and a control code generated by the controller of the power converting device could be increased by 1. Then, in step S342, the controller may generate the control signal to the power transistor of the power converting device with higher duty ratio corresponding to the control code, and the target voltage of the power converting device could be increased.

The steps 320 to S332 and S342 could be performed repeated for several times. Such as that, the output voltage of the power converting device could be dynamically adjusted, and the output voltage could be maintained at a target value regardless of a variation of the load status.

Figure 4:
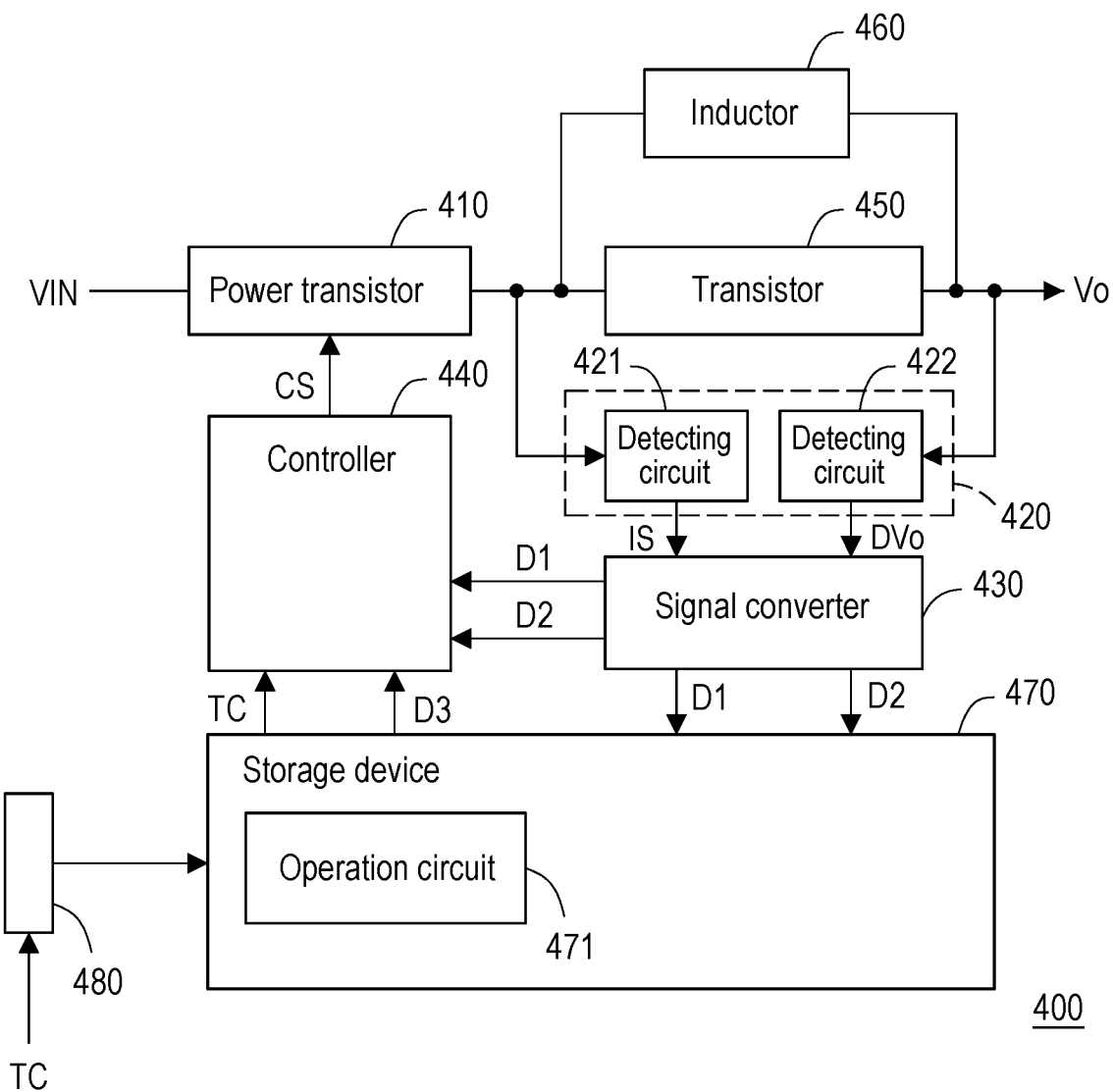
FIG. 4 illustrates a block diagram of a power converting device according to another embodiment of present disclosure.

Please refer to FIG. 4, which illustrates a block diagram of a power converting device according to another embodiment of present disclosure. The power converting device 400 includes a power transistor 410, a detecting device 420, a signal converter 430, a controller 440, a transistor 450, an inductor 460 and a storage device 470. In this embodiment, the power converting device 400 may be a DC-to-DC buck converter, and in other embodiments, the power converting device 400 may be reconfigured to a DC-to-DC boost converter by replacing a position of the inductor 460.

The power transistor 410 receives an input voltage VIN, is coupled to the controller 440 by a control end, and is coupled to the inductor 460, the transistor 450 and the detecting device 420. The inductor 460 is coupled to the transistor 450 and the detecting device 420 through an output end of the power converting device 400. The detecting device 420 includes detecting circuits 421 and 422. The detecting circuits 421 is coupled to the power transistor 410, and may detect an operation current flowing through the power transistor 410 to obtain a detection current IS in analog format. The detecting circuits 422 is coupled to the output end of the power converting device 400, and may divide an output voltage Vo on the output end of the power converting device 400 to obtain a detection voltage DVo in analog format.

The signal converter 430 is coupled to the detecting device 420. The signal converter 430 receives the detection current IS and the detection voltage DVo, and converts the detection current IS and the detection voltage DVo in analog format to a detection current D2 and the detection voltage D1 in digital format, respectively. The signal converter 430 transmits the detection current D2 and the detection voltage D1 to the controller 440. The signal converter 430 is further coupled to the storage device 470, and further transmits the detection current D2 and the detection voltage D1 to the storage device 470. The storage device 470 may store the detection current D2 and the detection voltage D1 in a memory array or a plurality of registers. In here, the memory array may be any type of memory arrays, such as a static random access memory (SRAM) array, a dynamic random access memory (DRAM) array, a flash memory array, a resistive random-access memory (ReRAM) or any type memory array well known by a person skilled in the art.

On the other hand, the storage device 470 may be coupled to an interface 480, and receives a target code through the interface 480. The storage device 470 may store the target code TC, and transmit the target code TC to the controller 440. In present embodiment, the controller 440 may determine the first voltage threshold value and the second voltage threshold value according to the target code TC. That is, a user of the power converting device 400 could dynamically adjust a target voltage of the power converting device 400 by inputting the target code TC to the storage device 470 through the interface 480. Moreover, the interface 480 may be a serial transmission interface or a parallel transmission interface. The interface 480 may be implemented by any transmission interface well known by a person skilled in the art, and no more special limitation here.

In present embodiment, the storage device 470 includes an operation circuit 471. The operation circuit 471 may perform an operation on the detection voltage D1 and the detection current D2 to obtain power rate information D3. The operation circuit 471 may store the power rate information D3 in the memory array or the registers of the storage device 470, and provide the power rate information D3 to the controller 440. In detail, the operation circuit 471 may multiply the detection voltage D1 by the detection current D2 to obtain the power rate information D3. In here, the detection voltage D1, the detection current D2 and the power rate information D3 are all digital codes.

On the other hand, the controller 440 may further set a power rate threshold value. The controller 440 may compare the power rate information D3 with the power rate threshold value to adjust the control code. For example, if the power rate information D3 is larger than the power rate threshold value, the controller 440 may reduce the control code, for decreasing a duty ratio of the control signal CS. Such as that, the operation current flowing through the power transistor 410 may be reduced.

It should be noted here, the controller 440 may monitor the operation current flowing through the power transistor 410 according to the detection current D2.

The controller 440 may be processors having computational capability. Alternatively, the controller 440 may be designed through hardware description languages (HDL) or any other design methods for digital circuits familiar to people skilled in the art and may be hardware circuits implemented through a field programmable gate array (FPGA), a complex programmable logic device (CPLD), or an application-specific integrated circuit (ASIC).

Figure 5:
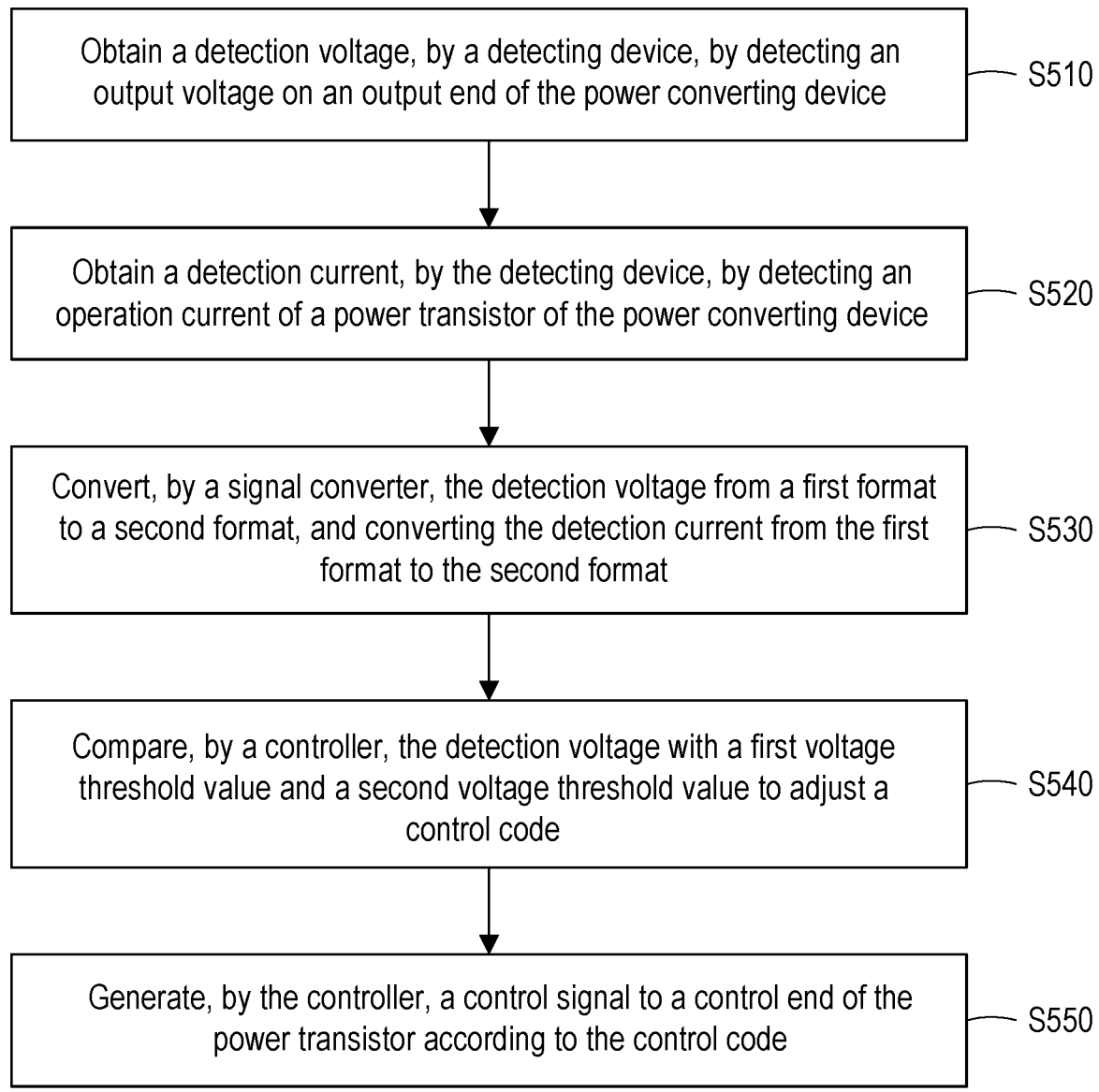
FIG. 5 illustrates a flow chart of a control method for a power converting device according to an embodiment of present disclosure.

Please refer to FIG. 5, which illustrates a flow chart of a control method for a power converting device according to an embodiment of present disclosure. In step S510, a detecting device of the power converting device obtains a detection voltage by detecting an output voltage on an output end of the power converting device. In step S520, the detecting device obtains a detection current by detecting an operation current of a power transistor of the power converting device. In step S530, a signal converter of the power converting device converts the detection voltage from a first format to a second format, and converts the detection current from the first format to the second format. In step S540, a controller of the power converting device compares the detection voltage with a first voltage threshold value and a second voltage threshold value to adjust a control code. In step S550, the controller generates a control signal to a control end of the power transistor according to the control code.

Detail operations of the steps 510 to 550 could be referred to the embodiments mentioned above, and no more repeated descriptions here.

In summary, the power converting device of present disclosure detects an operation current of a power transistor and an output voltage to generate a detection current and a detection voltage, respectively. By converting the detection voltage and the detection voltage to digital format. The power converting device compares the detection voltage with two voltage threshold values to adjust a control code, and converts the control code to a control signal for controlling an operation current flowing through the power transistor. That is, when a load status of the power converting device is varied, the output voltage of the power converting device could be dynamically adjusted to match a target voltage.

It will be apparent to those skilled in the art that various modifications and variations could be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A power converting device, comprising:
   a power transistor, coupled between an input end of the power converting device and an output end of the power converting device;
   a detecting device, coupled to the output end of the power converting device and the power transistor, obtaining a detection voltage by detecting an output voltage on the output end of the power converting device and a detection current by detecting an operation current of the power transistor;
   a signal converter, coupled to the detecting device, converting the detection voltage from a first format to a second format, and converting the detection current from the first format to the second format; and
   a controller, coupled to a control end of the power transistor and the signal converter, receiving the detection voltage and the detection current in the second format,
   wherein the controller compares the detection voltage with a first voltage threshold value and a second voltage threshold value to generate a comparison result, and generates a control signal to a control end of the power transistor according to a control code,
   wherein the controller decreases or increases the control code by a step value according to the comparison result.

2. The power converting device as claimed in claim 1, wherein the first voltage threshold value is larger than the second voltage threshold value, and if the detection voltage is larger than the first voltage threshold value, the controller decreases the control code by a first step value; if the detection voltage is smaller than the second voltage threshold value, the controller increases the control code by a second step value.

3. The power converting device as claimed in claim 2, wherein the first step value is equal or different from the second step value.

4. The power converting device as claimed in claim 1, wherein the detecting device comprises:
   a first detecting circuit, coupled to the output end of the power converting device for detecting the detection voltage; and
   a second detecting circuit, coupled to the power transistor for detecting the operation current to obtain the detection current.

5. The power converting device as claimed in claim 4, wherein the first detecting circuit generates the detection voltage by dividing an output voltage of the power converting device.

6. The power converting device as claimed in claim 1, wherein the signal converter is an analog-to digital converter, the first format is analog format, and the second format is digital format.

7. The power converting device as claimed in claim 1, wherein the controller adjusts a duty ratio of the control signal according to a variation of the control code.

8. The power converting device as claimed in claim 7, wherein when the control code is increased, the controller increases the duty ratio of the control signal; when the control code is decreased, the controller decreases the duty ratio of the control signal.

9. The power converting device as claimed in claim 1, further comprising:
a storage device, coupled to the controller and the signal converter,
wherein the storage device stores the detection voltage and the detection current.

10. The power converting device as claimed in claim 9, wherein the storage device provides the detection voltage and the detection current to the controller.

11. The power converting device as claimed in claim 9, wherein the storage device further receives a target code through an interface, and provides the target code to the controller.

12. The power converting device as claimed in claim 11, wherein the controller sets the first voltage threshold value and the second voltage threshold value according to the target code.

13. The power converting device as claimed in claim 9, wherein the storage device further comprises:
an operation circuit, being configured to perform an operation on the detection voltage and the detection current to obtain power rate information, the operation circuit provides the power rate information to the controller.

14. The power converting device as claimed in claim 13, wherein the controller further sets a power rate threshold value and compares the power rate information with the power rate threshold value to adjust the control code.

15. The power converting device as claimed in claim 1, wherein the controller further sets a current threshold value and compares the detection current with the current threshold value to adjust the control code.

16. The power converting device as claimed in claim 1, further comprising:
an inductor, coupled between the input end of the power converting device and a first end of the power transistor, or coupled between the output end of the power converting device and a second end of the power transistor; and
a transistor, coupled between the output end of the power converting device and the second end of the power transistor.

17. A control method for a power converting device, comprising:
obtaining a detection voltage, by a detecting device, by detecting an output voltage on an output end of the power converting device;
obtaining a detection current, by the detecting device, by detecting an operation current of a power transistor of the power converting device;
converting, by a signal converter, the detection voltage from a first format to a second format, and converting the detection current from the first format to the second format;
comparing, by a controller, the detection voltage with a first voltage threshold value and a second voltage threshold value to generate a comparison result;
decreasing or increasing, by the controller, a control code by a step value according to the comparison result; and
generating, by the controller, a control signal to a control end of the power transistor according to the control code.

18. The control method as claimed in claim 17, wherein the first voltage threshold value is larger than the second voltage threshold value;
if the detection voltage is larger than the first voltage threshold value, decreasing, by the controller, the control code by a first step value; and
if the detection voltage is smaller than the second voltage threshold value, increasing, by the controller, the control code by a second step value.

19. The control method as claimed in claim 18, further comprising:
when the control code is increased, increasing the duty ratio of the control signal by the controller; and
when the control code is decreased, decreasing the duty ratio of the control signal the controller.

20. The control method as claimed in claim 17, further comprising:
performing an operation on the detection voltage and the detection current to obtain power rate information; and
setting a power rate threshold value and comparing the power rate information with the power rate threshold value to adjust the control code.

* * * * *